(12) United States Patent
Kim et al.

(10) Patent No.: US 6,716,027 B2
(45) Date of Patent: Apr. 6, 2004

(54) SEMICONDUCTOR WAFER BOAT HAVING STACKABLE INDEPENDENTLY REPLACEABLE BOAT PARTS AND VERTICAL HEAT-TREATING APPARATUS COMPRISING THE SAME

(75) Inventors: Hong-Guen Kim, Suwon (KR); Bi-Cher Kim, Youngin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/970,690

(22) Filed: Oct. 5, 2001

(65) Prior Publication Data

US 2002/0092815 A1 Jul. 18, 2002

(30) Foreign Application Priority Data

Jan. 18, 2001 (KR) .......................................... 2001-2975

(51) Int. Cl.[7] ................................................. F27D 5/00
(52) U.S. Cl. ........................ 432/253; 432/258; 118/728; 392/418; 211/188
(58) Field of Search ................................. 432/253, 258; 118/728; 392/418; 211/188, 208

(56) References Cited

U.S. PATENT DOCUMENTS 4,407,654 A * 10/1983 Irwin .......................... 432/258
5,310,339 A * 5/1994 Ushikawa .................... 432/253
5,752,609 A * 5/1998 Kato et al. ................... 118/500
6,092,981 A * 7/2000 Pfeiffer et al. ............... 206/710
6,099,302 A * 8/2000 Hong et al. ............... 211/41.18

FOREIGN PATENT DOCUMENTS

JP 63-161610 * 7/1988

* cited by examiner

Primary Examiner—Jiping Lu
(74) Attorney, Agent, or Firm—Volentine Francos, PLLC

(57) ABSTRACT

A semiconductor wafer boat has a plurality of discrete boat parts stacked one atop the other. Each of the of the boat parts includes a wafer support in the form of a plurality of columns each having a plurality of vertically spaced apart grooves for use in supporting semiconductor wafers as vertically spaced from one another. Corresponding ones of the grooves in the columns of a boat part can receive the outer peripheral edge of the wafer directly, or a ring plate to which the wafer is mounted. Each adjacent pair of boat parts has confronting end portions forming a joint at which the boat parts of the pair are freely coupled to one another such that each of the boat parts may be replaced independently of the other boat parts. Thus, when any of the boat parts experiences thermal deformation after long periods of use, the boat part may be readily replaced without damaging any part of the boat and without the costs associated with replacing the boat entirely.

14 Claims, 6 Drawing Sheets

SEMICONDUCTOR WAFER BOAT HAVING STACKABLE INDEPENDENTLY REPLACEABLE BOAT PARTS AND VERTICAL HEAT-TREATING APPARATUS COMPRISING THE SAME

BACKGROUND OF THE INVENTION

1. Field of the Invention

The present invention relates to a wafer boat for holding a plurality of semiconductor wafers in a processing chamber of a vertical heating-treating apparatus.

2. Description of Related Art

In the manufacturing of semiconductor devices, a vertical heating-treating apparatus is used to perform a heat-treating process, e.g., thermal oxidation or thermal diffusion, on semiconductor wafers. A plurality of the wafers are so treated all together in what is known as batch processing. To this end, a large number of wafers are held by a heat-treating boat in a stacked state as spaced apart from one another. The boat is placed in a processing chamber of the heat-treating apparatus so that the wafers are heat-treated in their stacked state.

One example of a vertical heat-treating apparatus having a wafer boat for holding a plurality of wafers in a processing chamber is disclosed in U.S. Pat. No. 5,316,472 to Niino, et al. The semiconductor wafer boat disclosed in U.S. Pat. No. 5,316,472 includes four columns fixed to upper and lower support plates. Each of the columns has a plurality of first grooves defined at regular intervals in the vertical direction, and a plurality of second grooves disposed alternately with respect to the first grooves. The wafers are received in the first grooves, whereby they are supported substantially parallel to each other by the boat. Ring plates are received in each of the second grooves to ensure the uniformity of the thickness of a film to be formed on each wafer. Each ring plate has an outer diameter larger than that of a wafer, and an inner diameter smaller than that of the wafer. The ring plates are spaced from each other to provide sufficient clearance for allowing the wafers to be transferred into and out of the boat between adjacent ring plates.

Meanwhile, Japanese Patent Publication No. 2000-49106 discloses a semiconductor wafer boat having a pillar that will not deform. The semiconductor wafer boat disclosed in Japanese Patent Publication No. 2000-49106 includes a pillar extending vertically for supporting the wafers horizontally as spaced from one another by a specified interval, and an engagement part unitary with the pillar for suspending the boat from a boat loader while an upper part of the pillar is supported.

However, such conventional wafer boats suffer from thermal deformation when used for a long time, particularly because the wafer processing is preformed at high temperatures. Such thermal deformation occurs primarily in the columns that extend in a vertical direction orthogonally to the wafers. In particular, the thermal deformation is pronounced at an upper portion of the boat where the process gas accumulates, in a portion of the boat from which the process gas is exhausted, or where a ring plate and a column meet. As a result, the wafer boat may crack or flake.

Furthermore, such a wafer boat generally comprises quartz. Therefore, it is costly to replace the boat with a new one whenever thermal deformation occurs. Therefore, the tendency in the industry is to repair any deformed portion of the boat.

However, the columns of the wafer boat may be twisted during repair work such as the replacing of an old, deformed ring plate. A twisted column prevents the semiconductor wafers from being uniformly heat-treated. In addition, even if only a portion of the wafer boat is thermally deformed, the entire boat must often be replaced because the boat is formed as one body. Therefore, thermal deformation of a wafer boat gives rise to increased maintenance costs and, thus, increases the cost associated with manufacturing the semiconductor devices. Furthermore, the larger the wafer boat, the more the thermal deformation adversely affects the ability of the boat to facilitate a uniform heat treatment of the semiconductor wafers.

SUMMARY OF THE INVENTION

One object of the present invention is to provide a semiconductor wafer boat, and a semiconductor wafer processing apparatus comprising the same, by which batch after batch of semiconductor wafers can be heated uniformly.

Another object of the present invention is to provide a wafer boat, that is easy to maintain and repair.

A further object of the present invention is to provide a wafer boat that helps minimize the maintenance costs associated with operating a semiconductor wafer processing apparatus.

In order to achieve the above objects, the present invention provides a semiconductor wafer heat-treating boat that includes a plurality of stacked boat parts which are freely coupled to one another such that each of the boat parts is replaceable independently of the other boat parts.

The boat includes three types of such boat parts. Each of the boat parts includes a vertically extending wafer support having a plurality of vertically spaced apart support surfaces for use in supporting semiconductor wafers as vertically spaced from one another. The vertically extending wafer support has an upper and lower end portions, at least one of which is a free end defining half of a joint by which the boat part can be freely coupled to another boat part. A first type of this boat part includes an upper support plate and a plurality of first columns having upper and lower end portions. The upper end portions of the first column are joined with the upper support plate. A second type of boat part includes a plurality of second columns having upper and lower end portions. The upper end portions of the columns of a second boat part are coupled with the lower end portions of the first columns to form a first joint. The third type of boat part includes a lower support plate and a plurality of third columns having upper and lower end portions. The upper end portions of the third columns are coupled with the lower end portions of the columns of a second boat part to form a second joint. The lower end portions of the third columns are joined with the lower support plate.

Each of the joints may be made up of complementary convexo-concave end portions (one side convex, the other concave) of the first and second columns. Alternatively, the first and second columns may have an opening and a protrusion, respectively, at the end portions thereof. In this case, the opening has a shape suitable for producing a friction fit such that the protrusion is received in a snug manner.

Each of the first to third columns has a plurality of grooves extending perpendicular to the longitudinal axis of the column. The grooves are spaced from each other in the longitudinal direction of the column. The wafers may be received directly in the grooves. Alternatively, ring plates may be received in corresponding grooves of the columns of the boat parts. In this case, a plurality of main supports extend upright from the upper surface of each ring plate, and a plurality of protrusions extend from the main supports in a direction perpendicular thereto to substantially support a semiconductor wafer.

Because the heat-treating boat of the present invention has discrete separable boat parts, any part of the heat-treating boat in which thermal deformation occurs can be replaced. Thus, the boat is easy to maintain and repair. Also, the overall maintenance costs associated with the heating-treating apparatus are kept to a minimum. Also, repairing the heat-treating wafer boat is not likely to deform any parts of the boat. Accordingly, the semiconductor wafers will be uniformly heat-treated and thus, high quality semiconductor devices can be manufactured.

BRIEF DESCRIPTION OF THE DRAWINGS

These and other objects, features and advantages of the present invention will become clearer from the following detailed description of the preferred embodiment thereof made with reference to the accompanying drawings, in which like reference numerals denote like parts, and of which.

DETAILED DESCRIPTION OF THE PREFERRED EMBODIMENTS

The preferred embodiments of the present invention will now be described with reference to the accompanying drawings.

Figure 1:
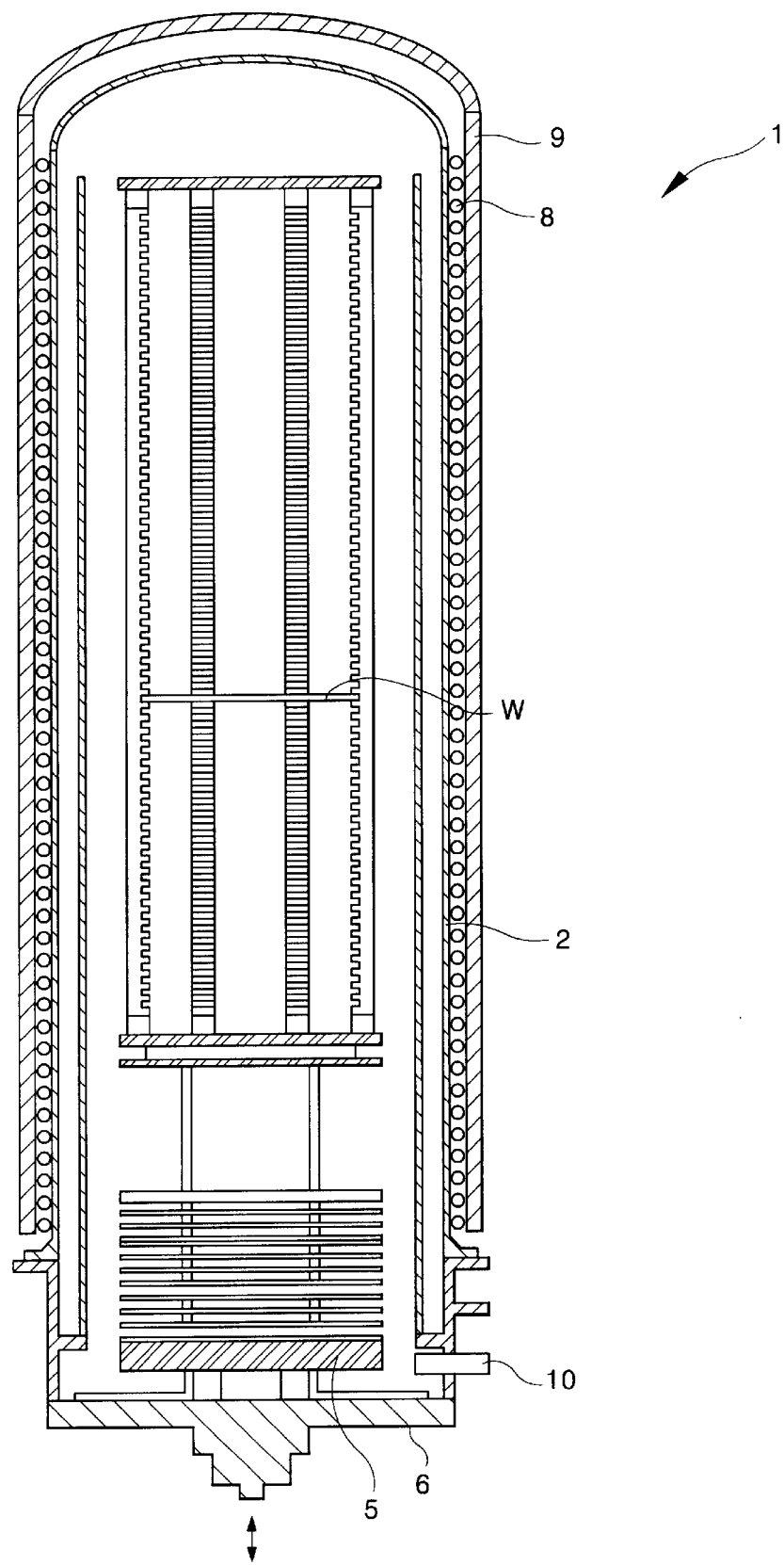
FIG. 1 is a sectional view of a vertical heat-treating apparatus having a wafer boat according to the present invention.

Referring now to FIG. 1, a vertical heat-treating apparatus 1 according to the present invention includes a quartz processing chamber 2. The processing chamber 2 has a long cylindrical shape and a closed top portion and open bottom portion. A heat-treating boat in which a plurality of wafers W are held is situated in the processing chamber 2. The boat can be loaded/unloaded into/from the processing chamber 2 by an elevator 15 (see FIG. 2). A heat-insulating cylinder 5 is disposed under the heat-treating boat 4. A lid 6 is, in turn, disposed under the heat-insulating cylinder 5 to open and close the bottom portion of the processing chamber 2. A heater 8 comprises a heating coil extending around the processing chamber 2 for heating the inside of the processing chamber 2 to a predetermined temperature. The processing chamber 2 and the heater 8 are covered with an outer shell 9 of a heat-insulating material.

A gas inlet pipe 10 is integrally molded to the bottom portion of the processing chamber 2 at one side thereof, whereas an exhaust pipe (see 13 in FIG. 2) is integrally molded to the bottom portion of the processing chamber 2 at the other side thereof.

Figure 2:
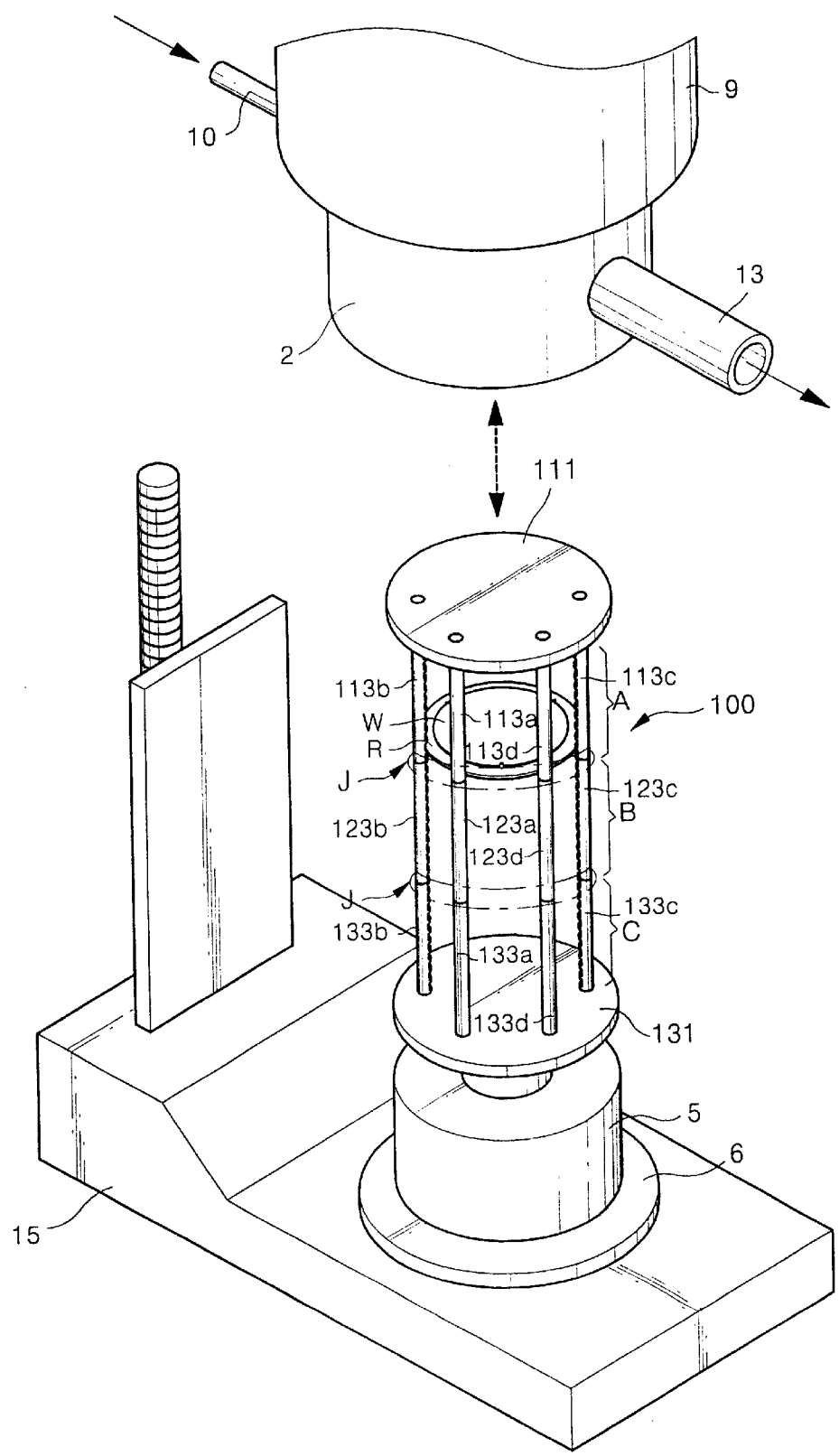
FIG. 2 is a perspective view of the wafer boat.
Figure 3:
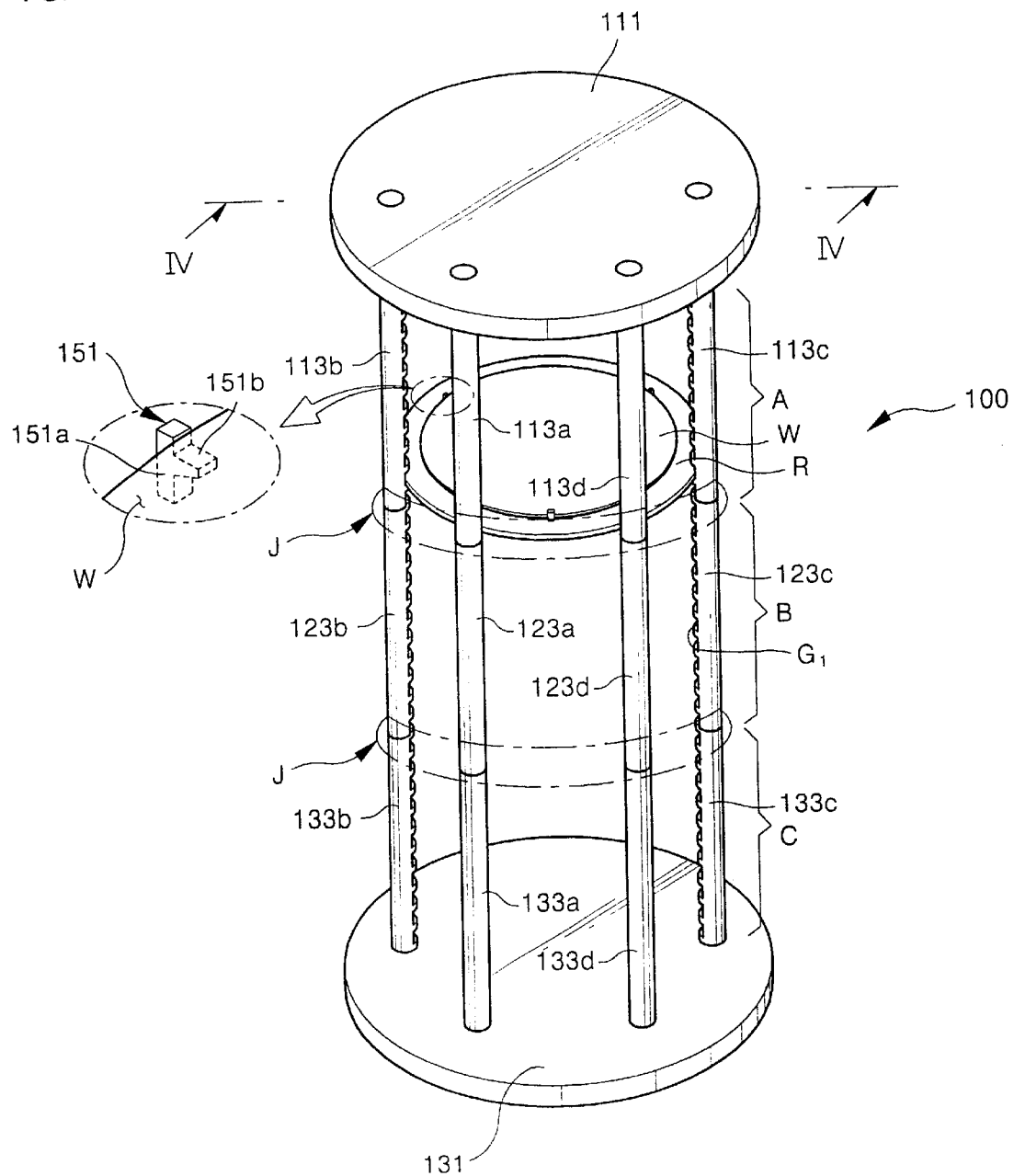
FIG. 3 is an enlarged perspective view of the wafer boat.
Figure 4:
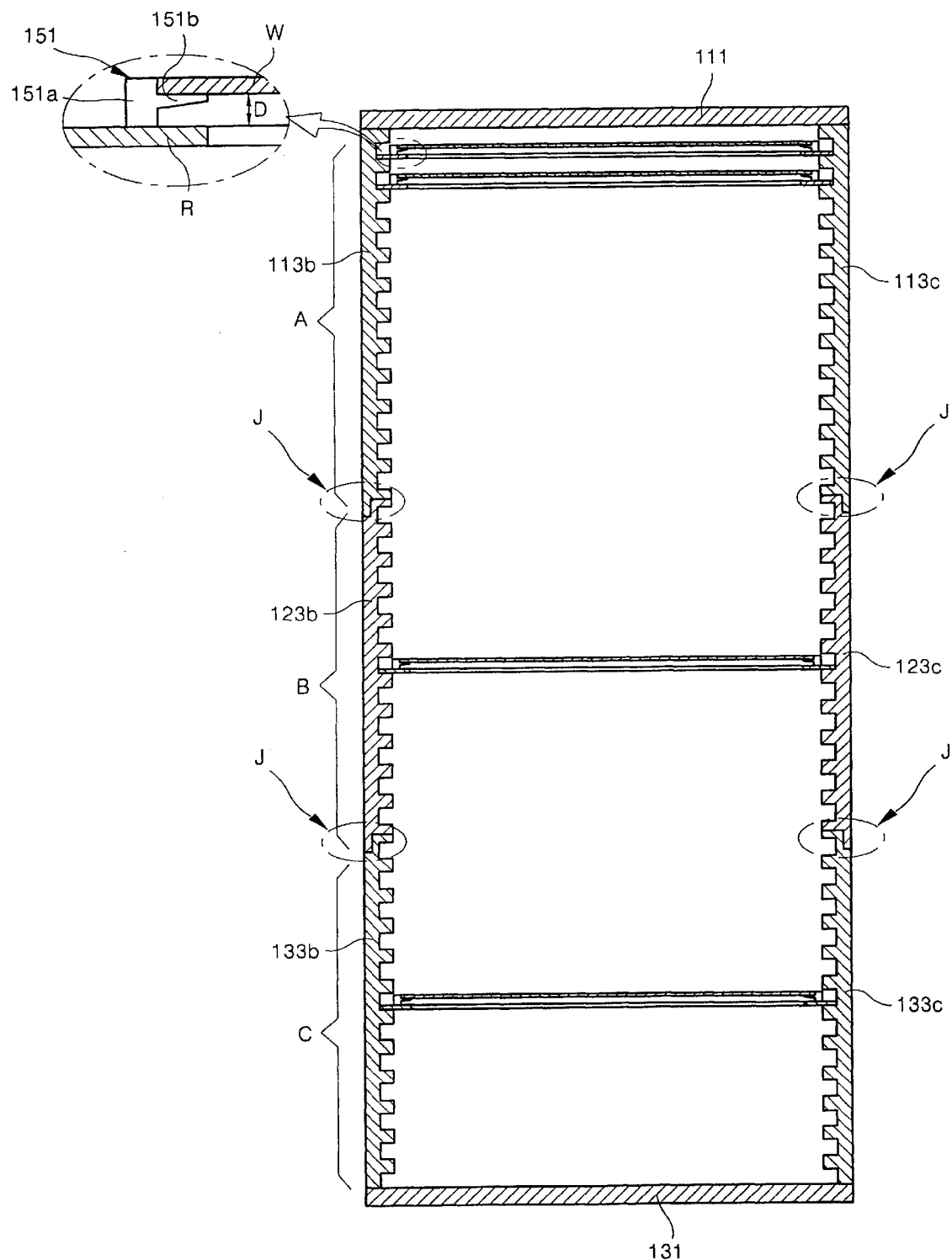
FIG. 4 is a sectional view of the boat taken along line IV—IV of FIG. 3.

FIG. 2 shows the heat-treating boat 100 removed from the processing chamber 2. Referring now to FIGS. 2–4, according to the present invention, the heat-treating boat 100 comprises a plurality of stackable and independently replaceable boat parts each of which comprises a wafer support, e.g. a plurality of columns, for use in supporting a plurality of wafers horizontally as spaced from one another in the vertical direction. More specifically, a first boat part A includes an upper support plate 111 and a plurality of first columns, e.g., four first columns 113a to 113d. Each of the first columns 113a to 113d has an upper end joined with the upper support plate 111. A second boat part B includes a plurality of second columns, e.g., four second columns 123a to 123d. The second columns 123a to 123d have upper ends freely coupled with the lower ends of the first columns 113a to 113d, respectively, at a joint J. A third boat part C includes a lower support plate 131, and a plurality of third columns, e.g., four third columns 133a to 133d. The third columns 133a to 133d have upper ends freely coupled with lower ends of the second columns 123a to 123d, respectively, at a joint J, and lower ends freely coupled with the lower support plate 131. Although the boat 100 shown in the figures has three such boat parts A to C, the present invention is not limited to that number of boat parts. That is, the wafer boat 100 may comprise more than one of the second boat parts B.

As is evident from the description above, the columns of each of the boat parts constitute a wafer support for use in supporting wafers. To this end, each of the columns has plurality of grooves G1 that extend in a direction perpendicular to the longitudinal axis of the column. The grooves G1 of each column are also spaced from each other in the longitudinal direction of the column. The bottoms of the grooves G1 are defined by support surfaces which support a plurality of wafer trays. In this embodiment, one hundred and seventeen wafer trays are supported.

Each wafer tray includes a ring plate R and a plurality of wafer supports 151. The ring plate R extends into corresponding ones of the grooves G1 in the columns of a particular boat part, e.g., boat part A in the figures. Each of the wafer supports 151 comprises a main support 151a disposed on the upper surface of the ring plate R and a projection 151b protruding in a direction perpendicular to the main support 151a. The projections 151b directly support a semiconductor wafer W. Preferably, the bottom surfaces of the projections 151b are spaced from the upper surface of the ring plate R by a distance D sufficient to allow a fork arm (not shown) to move up and down in the space when transferring the semiconductor wafer W.

Figure 6:
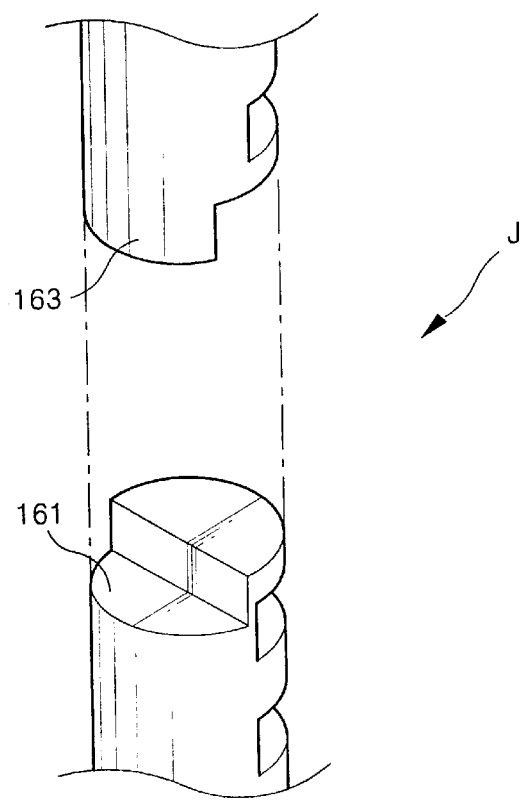
FIG. 6 is a perspective view of a joint of a column of the wafer boat according to the present invention.

FIG. 6 shows a section of a joint J according to the present invention. The joint is formed by a first convexo-concave portion 161 and a second convexo-concave portion 163 of respective columns of an adjacent pair of boat parts. The first convexo-concave portion 161 and second convexo-concave portion 163 have complementary shapes suitable for being mated to one another. However, the present invention is not limited to the specific shapes shown in FIG. 6

Figure 7:
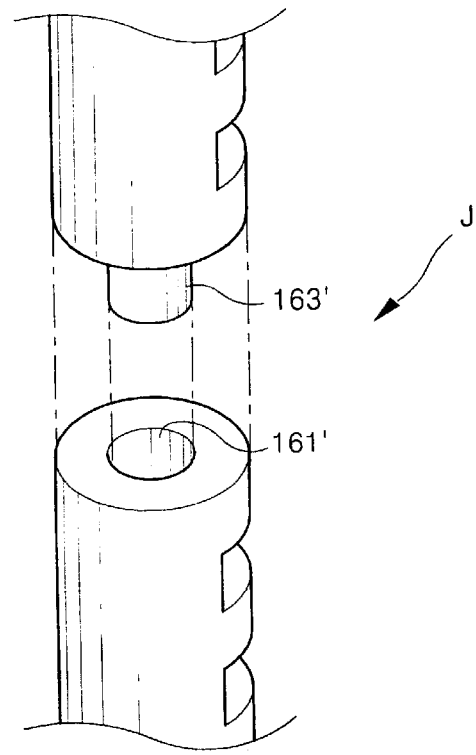
FIG. 7 is a partial perspective view illustrating an alternative form of the joint according to the present invention.

FIG. 7 shows another form of the joint according to the present invention. In this embodiment, the joint is formed by an opening 161' and a protrusion 163' at confronting end portions of the columns, respectively. The opening 161' may have any shape suitable for receiving the protrusion 163' in a snug manner. Thus, even though the opening 161' and protrusion 163' are shown as having circular cross sections, the present invention is not limited to such specific shapes.

Figure 5:
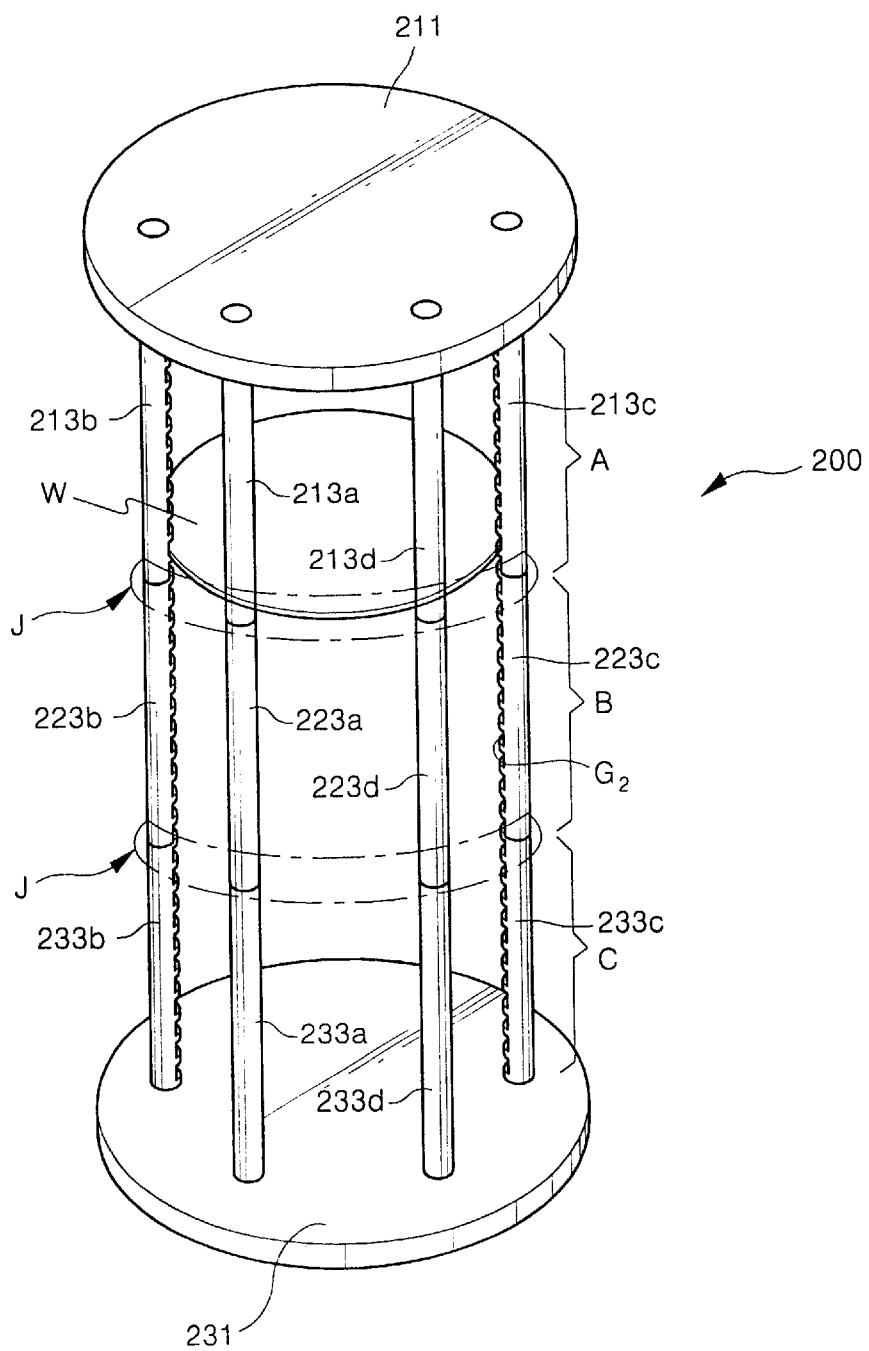
FIG. 5 is an enlarged perspective view of another embodiment of a semiconductor wafer boat according to the present invention.

FIG. 5 shows another embodiment of a heat-treating boat according to the present invention. As shown in FIG. 5, the heat-treating boat 200 includes a plurality of boat parts. As in the previous embodiment, three boat parts A to C are shown, but the present invention is not limited to any particular number of boat parts. The first to third boat parts A to C are stacked as freely coupled to each other so that each boat part A to C can be replaced, independently of the others.

The first boat part A includes an upper support plate 211 and a plurality of first columns, e.g., four first columns 213a to 213d. Each of the first columns 213a to 213d has an upper end joined with the upper support plate 211. A second boat part B includes a plurality of second columns, e.g., four second columns 223a to 223d. The second columns 223a to 223d have upper ends freely coupled with the lower ends of the first columns 213a to 213d, respectively, at a joint J. A third boat part C includes a lower support plate 231, and a plurality of third columns, e.g., four third columns 233a to 233d. The third columns 233a to 233d have upper ends freely coupled with lower ends of the second columns 223a to 223d, respectively, at a joint J, and lower ends joined with the lower support plate 231.

The joints J may have the same configuration as shown in FIGS. 6 and 7, and thus, will not be described here in further detail.

Each of the columns has plurality of grooves G2 that extend in a direction perpendicular to the longitudinal axis of the column. The grooves G2 of each column are also spaced from each other in the longitudinal direction of the column. The bottoms of the grooves G2 are defined by support surfaces which, in this embodiment, support the peripheral edge of the wafer itself. In addition, the columns of the second boat part B are discrete parts, but a transverse rod (not shown) may be provided to connect the second columns to each other.

Next, the manner in which the heat-treating boat of FIGS. 2–4 is both used and maintained will be described. First, semiconductor wafers W are set on the wafer supports 151 of ring plates R, respectively, by a fork arm (not shown). Then the wafer boat 100 is loaded into the processing chamber 2 by the elevator 15. The heater 8 is operated such that the semiconductor wafers W are heated to a predetermined temperature within the processing chamber 2. After the wafers W are done being processed, the elevator 15 lowers the wafer boat 100 from the processing chamber. The processed wafers are removed from the boat 100, a new batch of unprocessed wafers W are loaded into the boat 100, and the above-described process is repeated.

However, when the process is repeated for a long period of time, the heat-treating boat 100 experiences thermal deformation. As a result, cracks occur in the boat 100, especially in the portion thereof where process gas accumulates, i.e., in the upper support plate 111, in the portion thereof through which gas is exhausted, and/or in the portion thereof contacted by the ring plate R.

Therefore, any boat part which shows signs of thermal deformation is replaced. The elevator 15 lowers the boat 100 from the processing chamber, the thermally deformed boat part is uncoupled from the other boat parts and removed, and the boat is reassembled using a new boat part of the same type as the defective boat part. For example, when a thermal deformation occurs in an upper portion of the heat-treating boat, the first boat part A is merely pulled off of the second boat part B, and a new first boat part A is stacked on second boat part B.

Of course, the heat-treating boat 200 of FIG. 5 can also be repaired in the manner described above.

As described above, the heat-treating boat according to the present invention is made up of discrete separable boat parts, whereby any such boat part in which a thermal deformation occurs can be replaced. Accordingly, the boat is easy to maintain and repair and thus, helps minimize the costs associated with operating a vertical heat-treating apparatus. Also, repairing the wafer boat will not normally cause any portion of the boat to deform. Therefore, the semiconductor wafers will be heat-treated uniformly and thus, high quality semiconductor devices can be manufactured.

Finally, although the present invention has been particularly shown and described with reference to the preferred embodiments thereof, changes in form and details may be made thereto without departing from the spirit and scope of the invention as defined by the appended claims.

What is claimed is:

1. A semiconductor wafer boat comprising:

a first boat part, at least one second boat part and a third boat part stacked one atop the other, said first boat part comprising an upper support plate, and a plurality of vertically extending first columns having upper and lower end portions, the upper end portions of the first columns being connected to the upper support plate, each said second boat part including a plurality of vertically extending second columns having upper and lower end portions, upper end portions of the second columns of a said second boat part and the lower end portions of said first columns having complementary shaped end surfaces that are coupled with one another and cooperate to form a joint by which the first boat part and the second boat adjacent thereto are positioned relative to each other, said third boat part including a lower support plate, and a plurality of vertically extending third columns having upper and lower end portions, the upper end portions of the third columns and the lower end portions of the second columns of a said second boat part having complementary shaped end surfaces that are coupled with one another and cooperate to form a joint by which the third boat part and the second boat part adjacent thereto are positioned relative to each other, and the lower end portions of the third columns being connected to the lower support plate, each of the columns of said boat parts having a plurality of grooves extending therein perpendicular to the longitudinal axis thereof, the grooves of each said column being spaced from each other in the longitudinal direction of the column, the bottoms of said grooves being defined by a plurality of vertically spaced apart support surfaces, respectively, for use in supporting semiconductor wafers as vertically spaced from one another, the boat parts further comprising ring plates each received in corresponding grooves of the columns of a respective one of said boat parts as disposed on the support surfaces defining the bottoms of the corresponding grooves, and said joints being configured to allow each of the boat parts to be replaced freely and independently of the other boat parts.

2. The boat of claim 1, wherein the upper and lower end portions of the columns forming each said joint comprise first and second convexo-concave portions, respectively, the convexo-concave portions having complementary shapes such that the respective convexo-concave portions mate with each other.

3. The boat of claim 1, wherein the upper and lower end portions of the columns forming each said joint have an opening therein and a protrusion, respectively, and the opening has a shape corresponding to that of the protrusion such that the protrusion is snugly received in the opening.

4. The boat of claim 1, wherein each of the ring plates includes a plurality of wafer supports, each of the plurality of wafer supports having a main support extending upwardly from an upper surface of the ring plate, and a protrusion protruding in a direction perpendicular to the main support, the protrusions of the wafer supports of each said ring plate being spaced from one another along a path corresponding to the outer peripheral edge of a semiconductor wafer such that the protrusions will support a wafer at the periphery thereof.

5. A wafer boat part comprising a plurality of vertically extending columns and a plurality of ring plates, each of said columns having first and second end portions, and a plurality of grooves extending in the column perpendicular to the longitudinal axis thereof, the grooves of each said column being spaced from each other in the longitudinal direction of the column, the bottoms of said grooves being defined by a plurality of vertically spaced apart support surfaces, respectively, for use in supporting semiconductor wafers as vertically spaced from one another, at least one of the end portions of each of said columns being a free end having a shaped end surface forming one part of a joint by which the boat part can be freely coupled and positioned relative to another boat part as stacked one atop the other, and said ring plates each being received in corresponding grooves of the columns as disposed on the support surfaces defining the bottoms of the corresponding grooves.

6. The boat part of claim 5, wherein at least one of the end portions of each of the columns is convexo-concave, so as to receive a complementary convexo-concave end portion of a column of another boat part.

7. The boat part of claim 5, wherein at least one of the end portions of each of the columns has an opening extending therein from a terminal end surface thereof, for receiving a protrusion at the end portion of a column of another boat part.

8. The boat part of claim 5, wherein at least one of the end portions of each of the columns has a protrusion extending from a terminal end surface thereof, for being received by a corresponding opening in the end portion of a column of another boat part.

9. The boat part of claim 5, wherein each of the ring plates includes a plurality of wafer supports, each of the plurality of wafer supports having a main support extending upwardly from an upper surface of the ring plate, and a protrusion protruding in a direction perpendicular to the main support, the protrusions of the wafer supports of each said ring plate being spaced from one another along a path corresponding to the outer peripheral edge of a semiconductor wafer such that the protrusions will support a wafer at the periphery thereof.

10. The boat part of claim 5, and comprising a support plate to which the first ends of said columns are connected.

11. A vertical heat-treating apparatus for heat-treating semiconductor wafers, comprising:

a processing chamber having an open bottom end;

a heater operatively associated with said processing chamber so as to heat the inside of the chamber;

a wafer boat comprising a first boat part, at least one second boat part, and a third boat part stacked one atop the other, said first boat part comprising an upper support plate, and a plurality of vertically extending first columns having upper and lower end portions, the upper end portions of the first columns being connected to the upper support plate;

each said second boat part including a plurality of vertically extending second columns having upper and lower end portions, upper end portions of the second columns of a said second boat part and the lower end portions of said first columns having complementary shaped end surfaces that are coupled with one another and cooperate to form a joint by which the first boat part and the second boat adjacent thereto are positioned relative to each other, and said third boat part including a lower support plate, and a plurality of vertically extending third columns having upper and lower end portions, the upper end portions of the third columns and the lower end portions of the second columns of a said second boat part having complementary shaped end surfaces that are coupled with one another and cooperate to form a joint by which the third boat part and the second boat part adjacent thereto are positioned relative to each other, and the lower end portions of the third columns being connected to the lower support plate, each of the columns having a plurality of grooves extending therein perpendicular to the longitudinal axis thereof, the grooves of each said column being spaced from each other in the longitudinal direction of the column, the bottoms of said grooves being defined by a plurality of vertically spaced apart support surfaces, respectively, for use in supporting semiconductor wafers as vertically spaced from one another, the boat parts further comprising ring plates each received in corresponding grooves of the columns of a respective one of said boat parts as disposed on the support surfaces defining the bottoms of the corresponding grooves; and an elevator disposed beneath said processing chamber and to which said wafer boat is mounted, said elevator being movable between a first position at which said wafer boat is disposed in said processing chamber and a second position at which said wafer boat is disposed below said processing chamber.

12. The vertical heat-treating apparatus of claim 11, wherein the upper and lower end portions of the columns forming each said joint comprise first and second convexo-concave portions, respectively, the convexo-concave portions having complementary shapes such that the respective convexo-concave portions mate with each other.

13. The vertical heat-treating apparatus of claim 11, wherein the upper and lower end portions of the columns forming each said joint have an opening therein and a protrusion, respectively, and the opening has a shape corresponding to that of the protrusion such that the protrusion is snugly received in the opening.

14. The vertical heat-treating apparatus of claim 11, wherein each of the ring plates includes a plurality of wafer supports, each of the plurality of wafer supports having a main support extending upwardly from an upper surface of the ring plate, and a protrusion protruding in a direction perpendicular to the main support, the protrusions of the wafer supports of each said ring plate being spaced from one another along a path corresponding to the outer peripheral edge of a semiconductor wafer such that the protrusions will support a wafer at the periphery thereof.

* * * * *